US009520267B2

(12) United States Patent
Godet et al.

(10) Patent No.: US 9,520,267 B2
(45) Date of Patent: Dec. 13, 2016

(54) BIAS VOLTAGE FREQUENCY CONTROLLED ANGULAR ION DISTRIBUTION IN PLASMA PROCESSING

(71) Applicants: Ludovic Godet, Sunnyvale, CA (US); Jun Xue, San Jose, CA (US); Prashanth Kothnur, San Jose, CA (US); Umesh M. Kelkar, Santa Clara, CA (US); Matthew D. Scotney-Castle, Morgan Hill, CA (US)

(72) Inventors: Ludovic Godet, Sunnyvale, CA (US); Jun Xue, San Jose, CA (US); Prashanth Kothnur, San Jose, CA (US); Umesh M. Kelkar, Santa Clara, CA (US); Matthew D. Scotney-Castle, Morgan Hill, CA (US)

(73) Assignee: Applied Mateirals, Inc., Santa Clara, CA (US)

( * ) Notice: Subject to any disclaimer, the term of this patent is extended or adjusted under 35 U.S.C. 154(b) by 0 days.

(21) Appl. No.: 14/467,806

(22) Filed: Aug. 25, 2014

(65) Prior Publication Data
US 2015/0371827 A1 Dec. 24, 2015

Related U.S. Application Data

(60) Provisional application No. 62/015,143, filed on Jun. 20, 2014.

(51) Int. Cl.
*H01J 37/317* (2006.01)
*H01L 21/3065* (2006.01)
*H01J 37/32* (2006.01)

(52) U.S. Cl.
CPC ...... *H01J 37/3172* (2013.01); *H01J 37/32422* (2013.01); *H01J 37/32623* (2013.01); *H01J 37/32706* (2013.01); *H01L 21/3065* (2013.01)

(58) Field of Classification Search
CPC .............. H01J 37/3172; H01J 37/32422; H01J 37/32623; H01J 37/32706; H01L 21/3065
See application file for complete search history.

(56) References Cited

U.S. PATENT DOCUMENTS

| 8,101,510 B2* | 1/2012 | Godet | H01J 37/32623 118/723 R |
| 8,188,445 B2* | 5/2012 | Godet | 250/423 R |
| 8,288,741 B1* | 10/2012 | Miller | H01J 37/32082 250/492.21 |

(Continued)

*Primary Examiner* — Anita Alanko
(74) *Attorney, Agent, or Firm* — Blakely Sokoloff Taylor Zafman LLP

(57) ABSTRACT

The angular ion distribution in plasma processing is controlled using a bias voltage frequency. In one example, a plasma containing gas ions is generated in a plasma chamber. The plasma sheath is modified using an aperture disposed between the plasma sheath and the workpiece so that the plasma sheath takes a shape above the aperture. An oscillating radio frequency bias voltage is generated and applied to a workpiece holder. The workpiece holder applies the bias voltage to the workpiece to generate a workpiece bias voltage with respect to the plasma to attract ions across the plasma sheath toward the workpiece. The aperture and the frequency of the bias voltage control an angle at which the ions are attracted toward the workpiece.

17 Claims, 8 Drawing Sheets

(56) References Cited

U.S. PATENT DOCUMENTS

| | | | |
|---|---|---|---|
| 8,354,655 B2* | 1/2013 | Godet | H01J 37/3023 250/492.23 |
| 8,592,230 B2* | 11/2013 | Ramappa | C23C 14/042 136/255 |
| 8,603,591 B2* | 12/2013 | Godet | C23C 16/045 118/723 R |
| 8,664,098 B2* | 3/2014 | Godet | H01J 37/32623 118/723 R |
| 8,728,951 B2* | 5/2014 | Godet | H01J 37/32366 118/723 R |
| 8,937,004 B2* | 1/2015 | Renau | H01J 37/3171 438/513 |
| 2007/0006971 A1 | 1/2007 | Shannon et al. | |
| 2008/0132046 A1* | 6/2008 | Walther | H01J 37/08 438/513 |
| 2009/0294414 A1* | 12/2009 | Shannon | H01J 37/32091 219/121.54 |
| 2011/0151610 A1 | 6/2011 | Ramappa et al. | |
| 2014/0027274 A1 | 1/2014 | Godet et al. | |
| 2014/0034611 A1 | 2/2014 | Godet | |
| 2014/0037858 A1 | 2/2014 | Ma et al. | |
| 2014/0038393 A1 | 2/2014 | Godet | |

* cited by examiner

BIAS VOLTAGE FREQUENCY CONTROLLED ANGULAR ION DISTRIBUTION IN PLASMA PROCESSING

CROSS-REFERENCE TO RELATED APPLICATIONS

This application claims the priority of U.S. provisional patent application Ser. No. 62/015,143, filed Jun. 20, 2014, entitled Bias Voltage Frequency Controlled Angular Ion Distribution in Plasma Processing.

FIELD

The present description relates to plasma processing and, in particular, to controlling angular plasma ion distribution using a bias voltage frequency.

BACKGROUND

Plasma processing systems generate a plasma in a processing chamber that is then applied to a workpiece. The workpiece is supported in the chamber on a platen, a pedestal, a chuck, or some other support. The plasma may be used to perform a variety of different processes on the workpiece. These include etching material off the workpiece, doping materials that are already on the workpiece and adding material to the workpiece by deposition. The effects of these processes can be controlled by photolithography, screening, masking, coating and other processes.

The plasma itself is generated using a high voltage power supply and an input gas. The plasma generates a collection of ions and electrons with positive, negative and neutral electric charge that in combination have an overall quasi-neutral electric charge. This collection of plasma near the generator is driven across a sheath toward the workpiece by a bias voltage applied to the workpiece. The bias voltage generates an electrical field around the workpiece to attract ions through the sheath.

The plasma sheath is formed on any surface exposed to the plasma. There is a high electric field within the sheath. The field can accelerate positive ions and repel negative ions and electrons. When a workpiece is placed in a processing chamber and exposed to the plasma a sheath forms in a shape that conforms to the top of the workpiece surface. Similarly, a sheath will form on a grid placed between the plasma and the workpiece. The thickness and electric field of the sheath are determined by the relative voltage potential between the workpiece and the plasma. By applying a bias voltage to the workpiece, the ions of the plasma can be accelerated by the sheath to the workpiece.

In some systems, there is a grid between the sheath and the workpiece to direct the ions of the plasma sheath in a particular direction. The angular propagation of the ions can be used to control how the etching, doping, or deposition processes affect the workpiece. The ion energy distribution function (IEDF) describes the distribution of energy with which the ions impact a workpiece surface. The angular ion distribution function (AIDF) describes the distribution of the angle of incidence of the ions on the surface with respect to the normal from the surface. Ion energy distribution and angle distribution are descriptors for the interaction between a plasma and topographical features on the workpiece

SUMMARY

The angular ion distribution in plasma processing is controlled using a bias voltage frequency. In one example, a plasma containing gas ions is generated in a plasma chamber. The plasma sheath is modified using an aperture disposed between the plasma sheath and the workpiece so that the plasma sheath takes a shape above the aperture. An oscillating radio frequency bias voltage is generated and applied to a workpiece holder. The workpiece holder applies the bias voltage to the workpiece to generate a workpiece bias voltage with respect to the plasma to attract ions across the plasma sheath toward the workpiece. The plasma angle modifier aperture and the frequency of the bias voltage control an angle at which the ions are attracted toward the workpiece.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
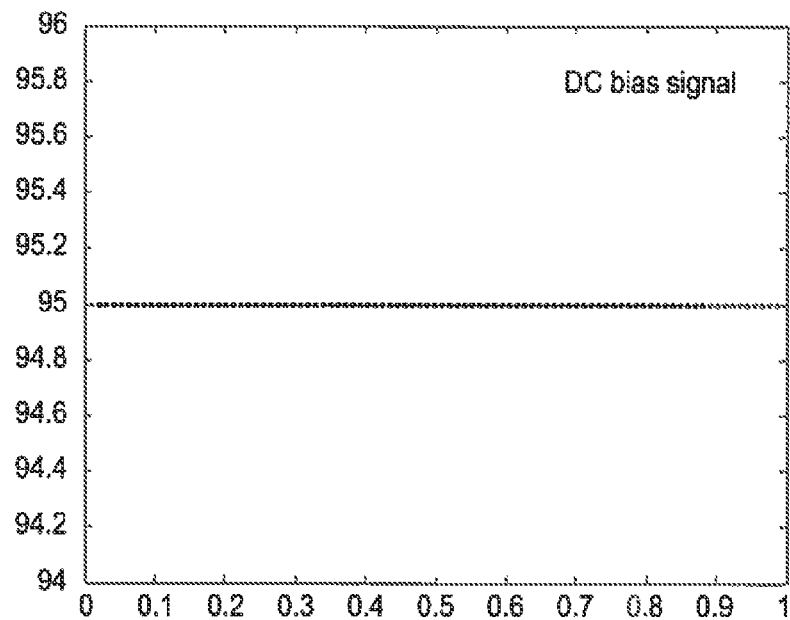
FIG. 1A is a graph of a DC bias voltage over time.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

FIGS. 1-4 are conceptualized diagrams of possible likely relationships between voltage, ion energy, pressure, and other parameters. The numerical scales are provided for comparison purposes but do not correspond to any particular specific apparatus. The graphed curves and scales are provided to illustrate the principles described herein and are not to be relied on as quantities for any particular application or implementation. FIG. 1A is a graph to show a typical DC (Direct Current) bias voltage as a signal on a graph in which voltage is plotted on the vertical axis against a horizontal time axis. The bias voltage is applied to the workpiece in the plasma chamber to control the attractive force applied to ions of the plasma.

Figure 1B:
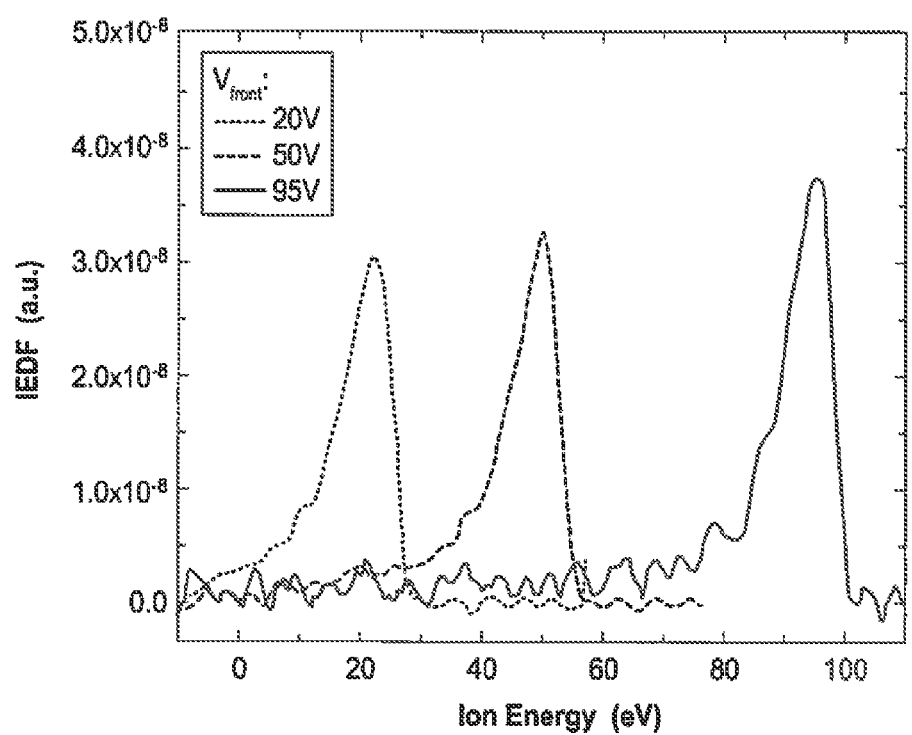
FIG. 1B is a graph of an ion energy distribution function in a plasma chamber using the bias voltage of FIG. 1A.

FIG. 1B is a graph to show an IEDF (Ion Energy Distribution Function) in atomic units on the horizontal axis against the actual ion energy in eV (electron Volts) for three different DC bias voltages. As shown, for a 20V input bias voltage, there is a first peak 102, for which the ion energy clusters around 20 eV. For a 50V input, there is a peak 104, at 50V and the ion energy clusters around 50 eV. For a 95V bias voltage there is a third peak 106 and the ion energy clusters around 95 eV. The energy increases with the bias voltage and for each DC bias voltage value, the ion energy clusters around a single value.

Figure 2A:
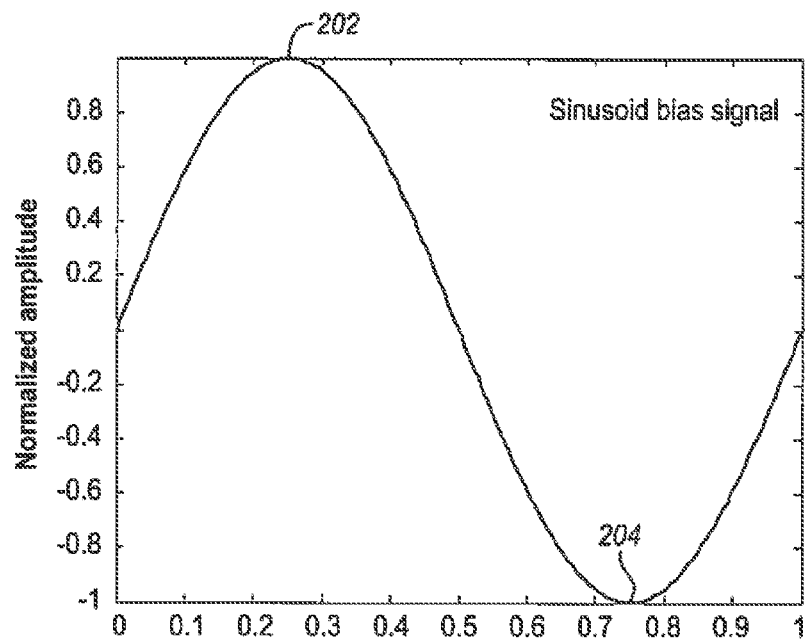
FIG. 2A is a graph of an RF bias voltage over time according to an embodiment of the present invention.
Figure 2B:
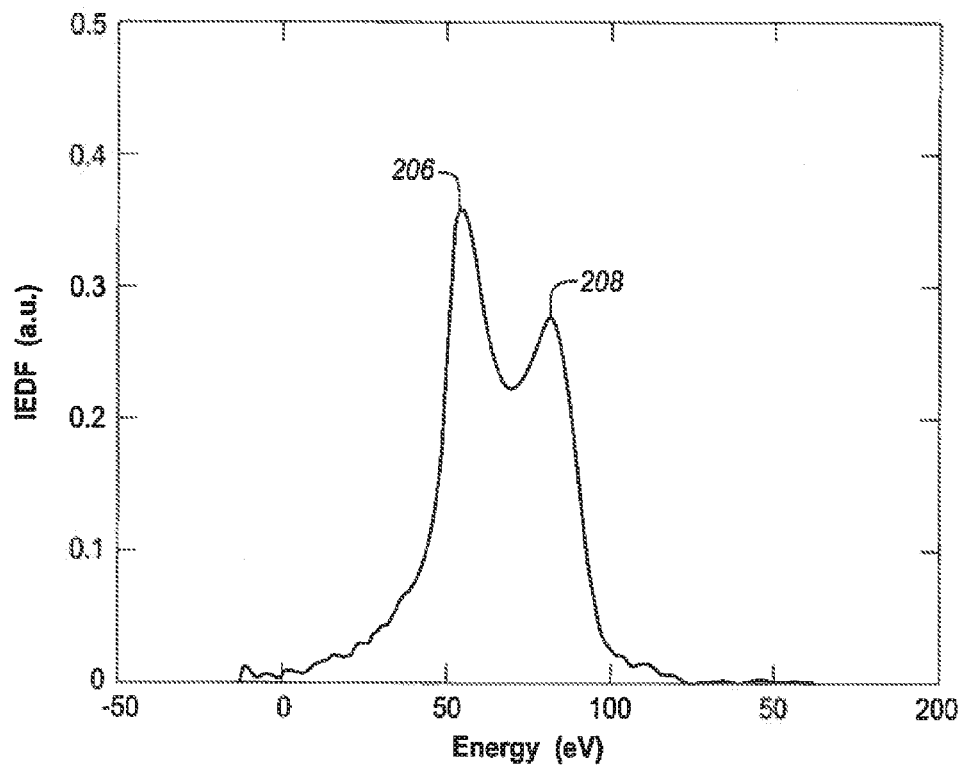
FIG. 2B is a graph of an ion energy distribution function in a plasma chamber using the bias voltage of FIG. 2A according to an embodiment of the present invention.

FIG. 2A is a graph to show an alternative bias voltage in the form of a sinusoid at a radio frequency. The sinusoid cycles across zero voltage for a positive peak voltage 202 and a negative peak voltage 204 for each cycle. FIG. 2B is a graph to show IEDF for the sinusoidal bias voltage. The ion energy now has a bimodal distribution with two energy peaks, one energy peak 206 for the positive voltage peak and one energy peak 208 for the negative voltage peak. The second peak corresponds to a lower ion energy than the first peak.

Figure 3:
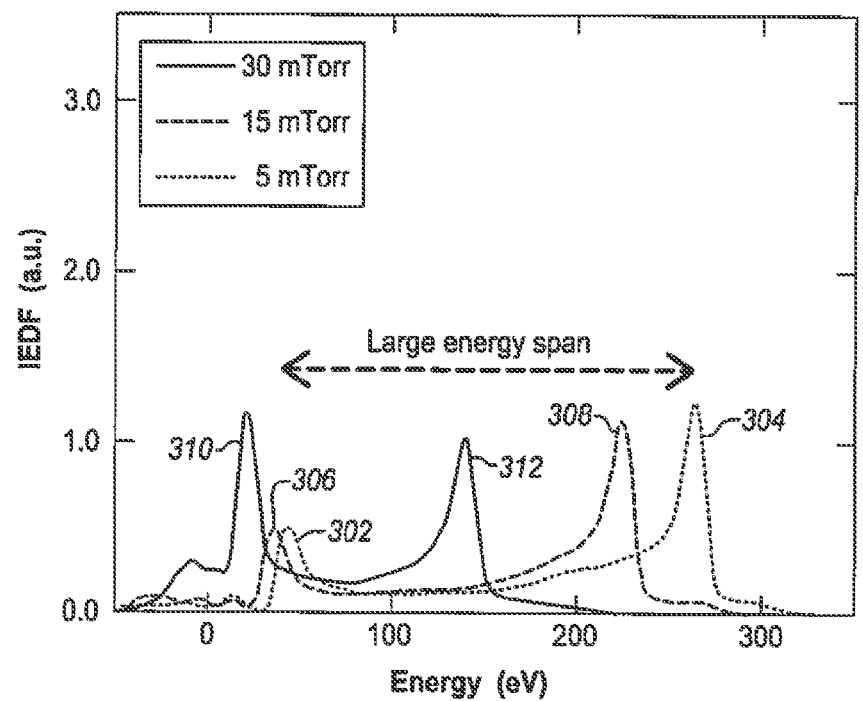
FIG. 3 is a graph of an ion energy distribution function for a 2 MHz bias voltage according to an embodiment of the present invention.
Figure 4:
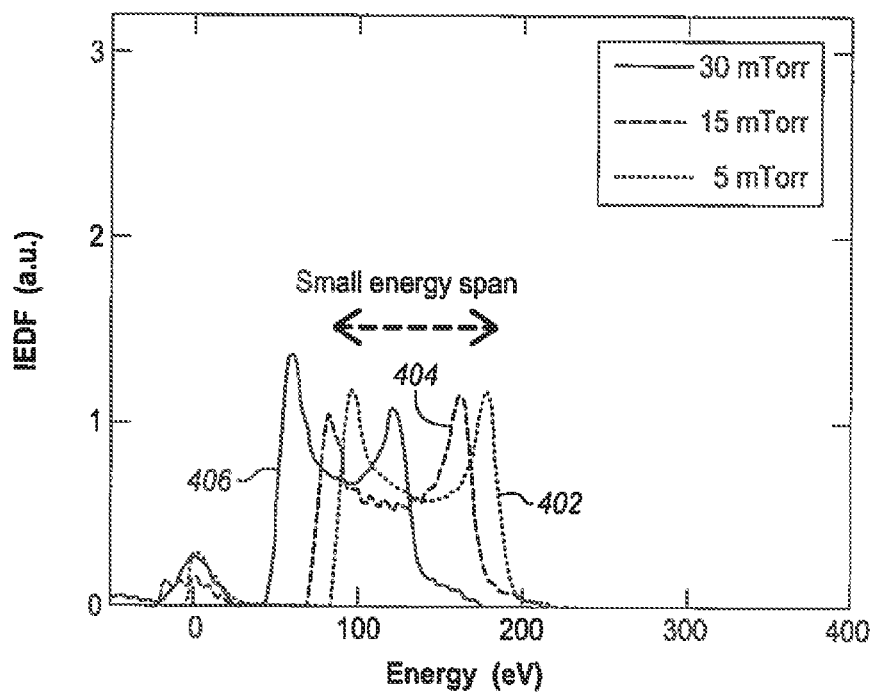
FIG. 4 is a graph of an ion energy distribution function for a 13.5 MHz bias voltage according to an embodiment of the present invention.

FIG. 3 is a graph of the IEDF over ion energy showing peaks when the bias voltage is driven at a relatively low frequency 2 MHz and 300 W. FIG. 4 is a graph of the same circumstances plotted on the same axes when the bias voltage is driven at a higher frequency of 13.5 MHz and the same 300 W. In each case, ion energy is shown for three different chamber pressures 5 mTorr, 15 mTorr, and 30 mTorr. Comparing FIG. 3 and FIG. 4, the ion energy peaks are higher in FIG. 4 and also closer together. The frequency of the bias voltage accordingly provides a way for the peak of the ion energy and the range of energies to be adjusted.

The ion energy with a DC bias voltage is very well controlled. The ion energy can be reduced or increased very quickly. With an RF bias voltage, with every RF cycle the electrons come to the surface of the charged material to remove any accumulated charge. The accumulated charge can be reduced by using a pulsed DC bias voltage. In this case the electrons typically can come to the surface with each pulse or every 50-100 µs. In the case of an RF bias voltage, the electrons can come to the surface with each cycle or about every 0.05 µs to 1 µs depending on the RF frequency. In addition, by changing the frequency of the RF bias voltage the energy and the peak position of the ion energy can be changed. This provides extra knobs to control the process.

When a pulsed DC bias voltage is used to control the angle and the energy of the ion beam, the range of control is limited by charging to a lower duty cycle (e.g. less than 25%). The range of control is also limited for low energy operation due to sheath thickness control at low energy. An RF bias provides a continuous wave operation. Pulsed RF allows the chemistry in a plasma chamber to be modified to balance deposition, etching, and sputtering processes. The plasma energy can be controlled using the RF frequency, the RF power, and the bias voltage duty cycle. Each of these may be changed individually or in combination, and provide minimal charging with high productivity. For pulsed RF bias voltages, duty cycles similar to those used for pulsed DC bias voltages may be used. As examples, the pulses may be on the order of 50-100 µs with a duty cycle ranging from 20% to 80%. This pulse rate is significantly slower than the cycle rate of the RF plasma power which is in the MHz range.

Referring to FIG. 3 in more detail, the distance between peaks also changes with chamber pressure. FIG. 3 shows a first energy distribution curve with a first peak 302 at about 30 eV and a second peak 304 at about 270 eV. This represents the IEDF at a lowest pressure of 5 mTorr. A second energy distribution curve has a first peak 306 that is a little lower at about 20 eV and a second peak 308 that is much lower at about 210 eV. This represents the energy distribution at a chamber pressure of about 15 mTorr.

At a third, higher pressure of about 30 mTorr, the energy distribution curve has a first peak 310 of about 10 eV and a second peak 312 at about 150 eV. These values are still lower. In addition, it may be seen that the distribution between the two peaks at the highest pressure is more similar. The lower pressure curves show much less distribution at the low energy peak than at the second higher energy peak while the third highest pressure curve shows about the same distribution at both peaks. Accordingly, the chamber pressure can be used to adjust the ion energy values and the distribution. At low pressure, ion energy is concentrated at a single value as represented by the second peaks 304, 308.

In FIG. 4, there are three curves 402, 404, 406 corresponding to the same three increasing pressures as in FIG. 3 but now with the higher 13.5 MHz RF bias voltage. As shown, the difference in pressure makes much less difference in the curve, yet the lower pressure curve 402 shows more difference in the energy of its two peaks than the highest pressure curve 406.

The fabrication process of a workpiece in a plasma chamber may be better controlled by controlling both the ion energy distribution and the ion angle distribution to favor a desired process. By tuning the driven plasma frequency and the bias frequency applied to a sheath grid through the workpiece bias voltage, an ion flux can be produced from a plasma with a desired energy distribution along a desired angle. The sheath grid design may also be adapted for better precision. A variety of different structures may be used as a plasma angle modifier. A grid is a conventional structure but other structures that apply a charge across one or more apertures, openings or holes may be used. These structures are referred to generally as angle modifiers herein because they are used to modify the angular ion energy of ions from the plasma. With this angular ion energy control technique, much better profile control and better selectivity are obtained. The plasma may be used for anisotropic etch, isotropic etch, directional film deposition and other processes. The bias voltage frequency and bias voltage amplitude provide helpful parameters for tuning a process for better and more accurate process control.

The ion energy distribution of an RF (Radio Frequency) plasma is correlated to the driven bias voltage frequency. The plasma's ion energy distribution when driven at RF bias voltage is a typical bimodal distribution as shown in the IEDF curves of FIGS. 3 and 4. The lower the driven frequency, the greater the energy separation between the two energy peaks of the bimodal distribution. At higher driven frequencies, the ions are not able to respond to the higher frequency but only the average sheath voltage. As a result, the ion energy distribution is more like a distribution with a single peak. The peaks may also be controlled by pulsing the RF energy.

In a plasma process chamber in which there is an angle modifier between the plasma sheath and a workpiece, the physical dimensions of the angle modifier change the direction of the ions between the sheath and the workpiece. By changing the plasma sheath thickness and angle modifier dimensions, ions can be extracted from the plasma along different angles. Accordingly, when processing a workpiece with a plasma, the ion energy distribution and the preferred angle distribution can be controlled using the driven RF bias voltage frequency and the angle modifier.

When the angle modifier between the plasma sheath and the workpiece has a gap defined by two panels of the angle modifier, the electric field lines between the plasma sheath and the workpiece are shaped by the angle modifier. The panels may be made of a conductive, semiconductor, or dielectric material. In many cases an arcuate boundary is formed between the plasma and the plasma sheath over the gap. This arcuate boundary will typically have a convex shape relative to the angle modifier and therefore to the plane of the top surface of the workpiece. The shape of the boundary is also influenced by any bias voltage that might be applied to the angle modifier. For other angle modifier configurations, the boundary will be formed to other shapes.

The arcuate shape of the boundary affects the electric field lines within the plasma sheath. The incident angles at which the ions strike the workpiece will be distributed consistent with the influence of the electric field. A large range of incident angles enables conformal doping of three dimensional structures. For example, the sidewalls of a trench structure may be more uniformly doped with ions having a large range of incident angles. Other boundary shapes will cause the ions to strike the workpiece at other angles which may correspond to a wide or narrow range.

Figure 5A:
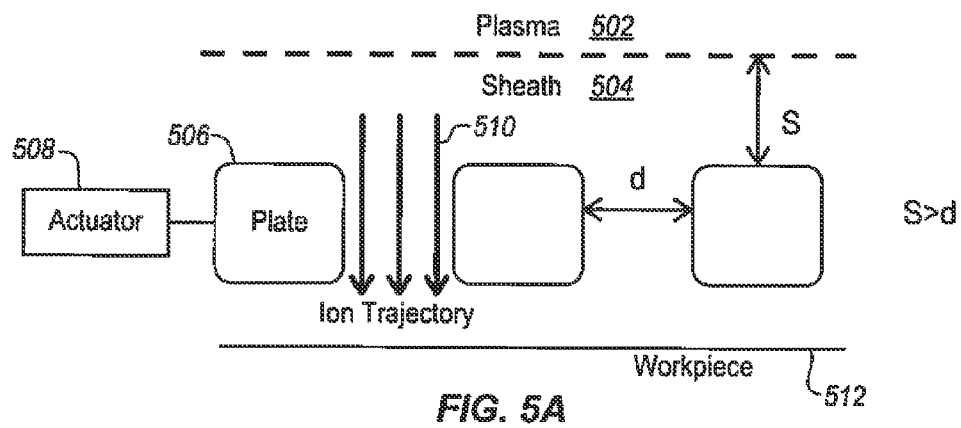
FIGS. 5A, 5B, and 5C are diagrams of a plasma processing apparatus showing ion path angles with different sheath thicknesses proximate an angle modifier aperture according to an embodiment of the present invention.

FIG. 5A is a diagram of plasma processing using an extraction plate as the angle modifier with a simple aperture or gap in the plate between the plasma sheath and the workpiece. A plasma 502 may be generated in any of a variety of different ways. A workpiece 512 is supported inside the chamber on a platen, pedestal, chuck, table, or other support. A plate 506 is positioned between the plasma and the workpiece. A plasma sheath 504 is formed between the plasma and the workpiece and is shaped based, at least in part on the configuration of the plate. The sheath depends on the plate geometry, the plasma parameters, and the bias voltage, if any, that is applied to the plate. In the illustrated example, the distance S between the plasma and the plate is greater than the size d of the gap between parts of the plate. As a result, the ions 510 are pulled directly through the plate aperture to the workpiece. This plate configuration may be used to provide direct vertical ion impact on the top surface of the workpiece in each location that is directly beneath a gap. The position of the impact may be adjusted by moving the plate or by moving the workpiece.

The plate 506 is optionally connected to an actuator 508 that is able to move the plate in the Z-direction to change the effect of the plate. In other words, the vertical spacing (Z) between the plate which functions as a sheath modifier 506 and the plane defined by the top surface of the workpiece may be adjusted. The actuator may be mechanically coupled to the one or more pieces of the plate to drive the two pieces in a vertical direction relative to the workpiece. The Z position of the pieces of the plate relative to the top plane of the workpiece, and also relative to each other, influences the shape of the boundary between the plasma and the plasma sheath and also the trajectories of the ions striking the workpiece. The actuator 508 may include or be controlled by a controller (not shown). Alternatively, the plate may be configured for a particular process outside of the plasma chamber and installed into the chamber without further adjustment so that no actuator is used.

Figure 5B:
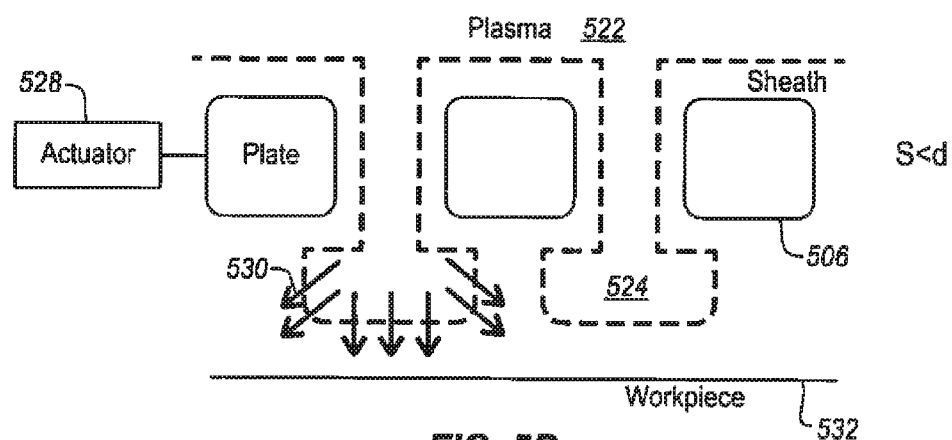
Figure 7:
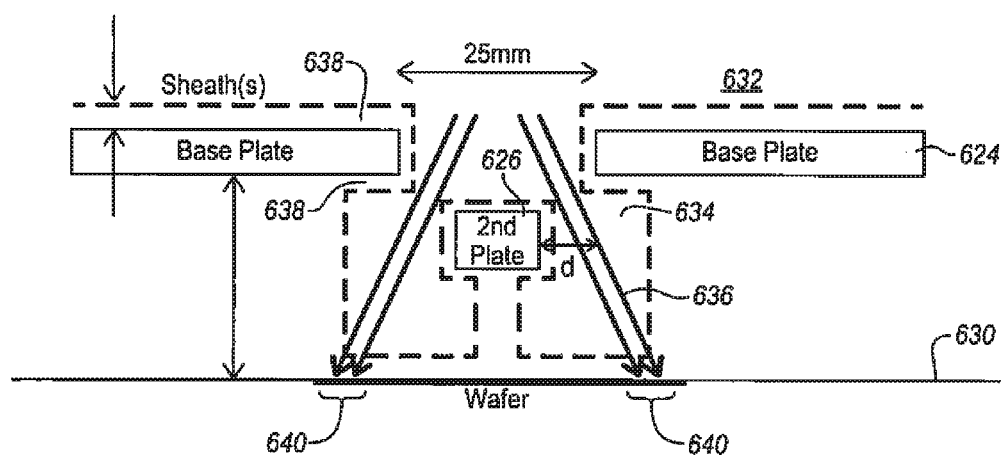
FIG. 7 is a diagram of a plasma processing apparatus showing ion path angles with the angle modifier of FIG. 6B according to an embodiment of the present invention.

FIG. 5B is a diagram of the plasma processing system of FIG. 5A in which the actuator 528 has moved the plate 526 closer to the plasma 522. Alternatively, this configuration may be obtained by changing the plasma parameters, such as plasma density and electron temperature, or the bias voltage on the plate. These factors all may be used to change the thickness of the sheath. In this case the distance S which is the sheath thickness is less than the distance d across the gap. This causes the plasma to extend through the gaps. The ions are drawn from the plasma across the sheath 524 to the workpiece 532 at a range of incident angles. The range of angles is related to the extension of the plasma through the gaps. The extension of the plasma is related to the relationship of S to d. The actuator may be configured to change the distance S and the distance d. In addition, the plate may have additional components as shown in FIG. 7 and these may also be moved by the same or additional actuators.

Figure 5C:
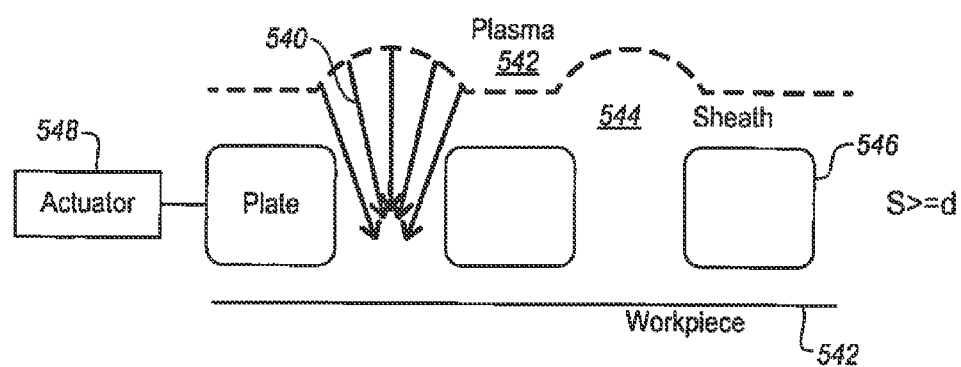

FIG. 5C is a diagram of the plasma processing system of FIG. 5A in which the actuator 548 has moved the plate 526 to a position in which the sheath thickness S is about the same as the distance d across a gap. This may also be accomplished without moving the plate but by changing the plasma and sheath bias voltage parameters. In this case, an arcuate sheath boundary is formed above the plate so that the ions 550 are drawn across the sheath 544 to converge at a particular point above the workpiece 552. The angular distribution of ions on the workpiece may be affected by adjusting the position of the workpiece.

In this case the boundary between the plasma and the plasma sheath has a convex shape relative to the workpiece. The boundary may have a deeper or shallower shape depending on the specific Z position of the plate. The angular spread of ions striking the workpiece with a relatively lower Z-position is greater than the angular spread of ions striking the workpiece with a relatively higher Z-position. In addition, ions strike a wider horizontal spacing across the surface of the workpiece with the lower Z-position compared to the horizontal spacing with the higher Z-position.

The relationship between S and d may be adjusted by changing S as shown, or by changing d. The horizontal spacing d between two pieces of the plate may be adjusted to change the width of the aperture or gap. An actuator may be mechanically coupled to at least one of the pieces or the plate may be pre-configured.

Figure 6A:
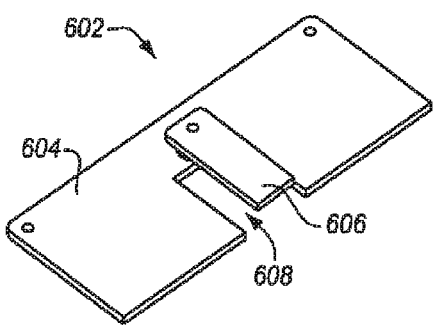
FIGS. 6A and 6B are perspective views of a portion of a sheath modifying angle modifier showing an ion aperture according to an embodiment of the present invention.
Figure 6B:
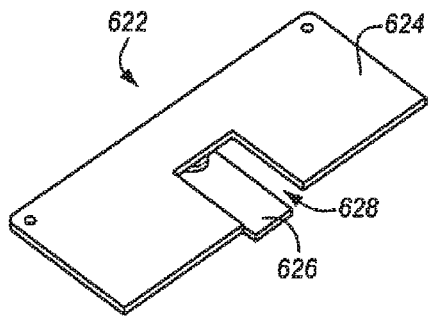

A relatively shorter horizontal gap position provides a narrower convex boundary between the plasma and the plasma sheath. As a result, a larger corresponding central portion of the workpiece is struck with ions. A wider horizontal gap generates a wider convex boundary shape that is flatter and less circular. This creates a narrower impact area for ions traveling through the gap. The difference between the collimated beam of FIG. 5A, the spread beam of FIG. 5B, and the converged beam of FIG. 5C depends on the relationship between S and d. If the sheath thickness S remains constant, then a converged beam is obtained by using a wider horizontal plate gap. The ion beam may become a collimated beam by using a shorter horizontal plate gap FIG. 6A is a perspective view of a portion of alternative plate 602 with two levels. A base plate 604 forms the primary structure of the plate and includes a slot or gap 608 as described above. A second plate 606 is placed in, above, or below the gap. In FIG. 6A, the second plate is above the gap. In FIG. 6B an alternative plate 622 has a base plate 624 with a slot 628 and a second plate below the slot. The position of the second plate may be altered to suit different applications. There may also be actuators as in FIG. 5A to move the second plate with respect to the base plate as well as to move the entire plate with respect to the plasma or the workpiece.

The two-part plate of FIGS. 6A and 6B form a bimodal plate. The plate may be grounded or a bias voltage may be applied so that the sheath thickness may be modified to be either increased or decreased, depending on the particular use for the plasma. The bias plate may also be allowed to float so that the ions are focused by the sheath around the surface of the plate. Only a single gap 608, 628 and a single second plate piece 606, 626 are shown for simplicity. There may be many more gaps depending on the workpiece, the process that is to be performed, the processing chamber, and the particular implementation.

FIG. 7 is a side cross-sectional view of the bimodal plate of FIG. 6B in the context of a plasma processing chamber. The plasma 632 has a sheath 638 between the plasma and the plate 624. Due to the configuration of the second plate with respect to the base plate, the plasma has an extension 634 past the aperture 628 to the other side of the base plate. A bias voltage on a workpiece 630 draws the ions through the sheath in a pattern that is controlled in part by the position of the second plate and in part by the size and position of the opening through the plate. The observations in the context of FIG. 5B regarding S and d still apply, however, with the bimodal plate d may not be defined as the gap on either side of the second plate to the base plate.

A bimodal angular spread 640 of the ions 636 impinging on the workpiece can be created using the configuration shown in FIG. 7 or similarly using the bimodal plate of FIG. 6A. A bimodal angular spread refers to a first center angle having a first angular distribution and a second center angle having a second angular distribution. Such a bimodal angular spread may also be created by changing the relative vertical position of only two portions of a plate. Using an appropriate sheath thickness, e.g. the sheath thickness is approximately equal to the plate opening an angled diffused beam is obtained. The middle plate board can block the vertical beams so that two angled beams impinge on the workpiece.

In FIG. 7, there are effectively three conductors, the second plate and the two parts of the base plate on either side of the second plate. By arranging the outer two pieces of the base plate on the same vertical plane and maintaining the same horizontal spacing between them, it is possible to create a symmetric bimodal angular spread each centered about the ions that fall on either side of the second plate. The center angles can be modified by varying the vertical spacing between the two outer parts of the base plate and the second plate, so as to vary the gap angles. The angular spread can be modified by varying the horizontal spacing between the two parts of the base plate. An asymmetric distribution can be created by making the two parts of the base plate different heights.

While the conductive plate parts are shown as being planar, this is not a requirement. The plasma sheath generally follows the shape of the plate and is then affected by the bias voltage. Therefore, the sheath can be made to take a variety of different shapes that may be linear, non-linear, curved or curvilinear, such that any gap through which the ions travel may be at a variety of different angles to the workpiece.

As described herein a bias voltage can be applied to the plasma, the angle modifier and the workpiece, through the workpiece carrier. This provides a large variety of control configurations to affect the IEDF and the AIDF. When RF energy is used it may be scanned or a combination of two or more different combined frequencies. In some embodiments, a scanning frequency RF energy is applied to the plasma source with the angle modifier at ground potential and the workpiece biased at a fixed frequency. In some embodiments, a fixed frequency RF energy is applied to the plasma with the angle modifier driven with a scanning frequency RF bias voltage and workpiece at a fixed frequency. In various embodiments, a ground potential, a DC bias, a fixed or scanning RF bias, or a combined RF and DC bias may be applied to any one or more of the plasma, the angle modifier and the workpiece. Different combinations may be used to produce desired results under different circumstances.

Figure 8:
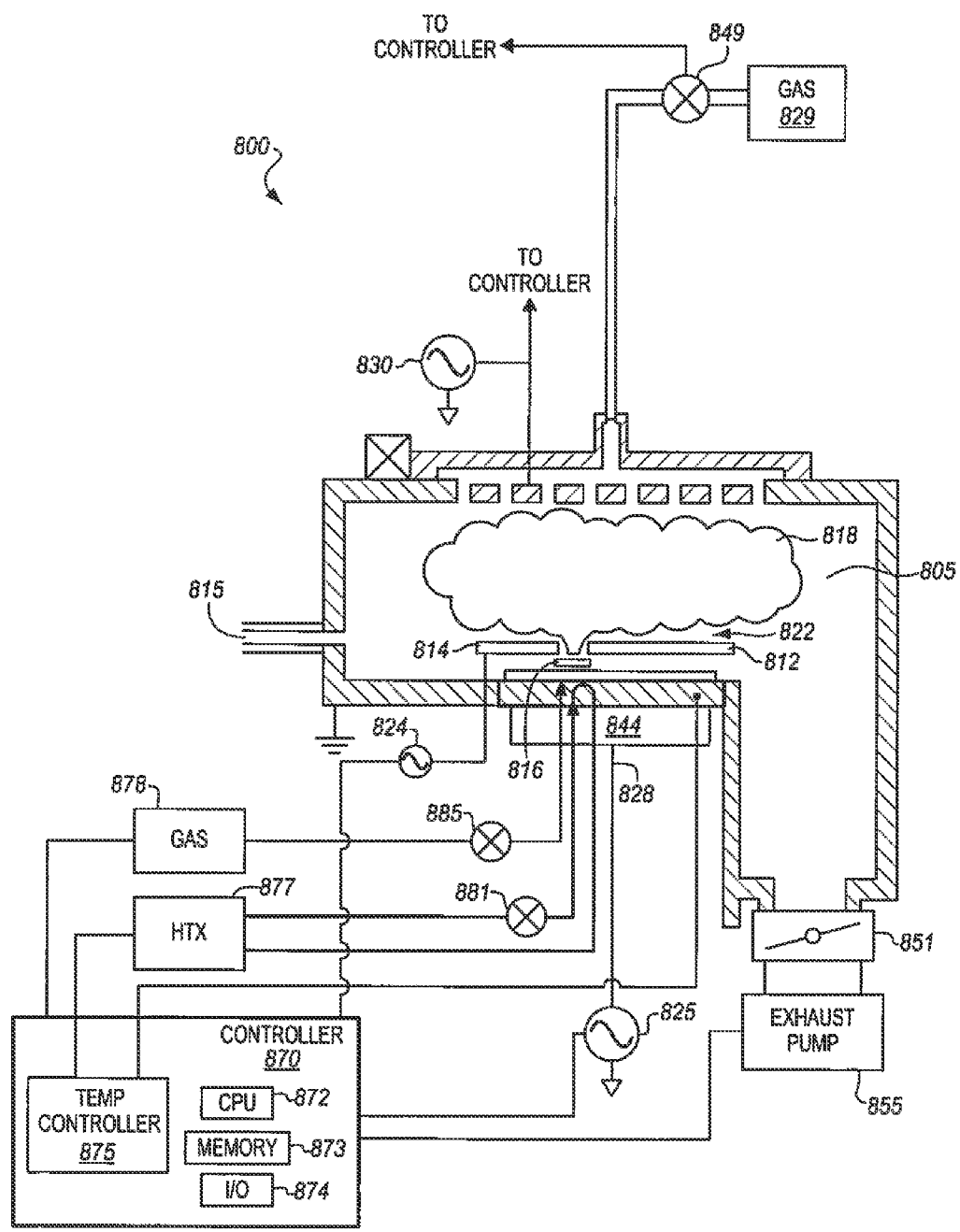
FIG. 8 is a diagram of a plasma processing apparatus for a workpiece according to an embodiment of the present invention.

FIG. 8 is a schematic of a wafer processing system 800 that may be used for plasma etch, ion doping, ion deposition, or for a variety of other purposes. The system includes a workpiece support assembly 842 which may be a platen, a carrier, a chuck, a pedestal, or any other workpiece support system. The processing system 800 may be any type of chamber known in the art, such as, but not limited to, Enabler®, DPS II®, AdvantEdge™ G3, EMAX®, Axiom®, or Mesa™ CIP chambers, all of which are manufactured by Applied Materials of California, USA. Other commercially available processing chambers may similarly utilize the techniques and apparatus described herein. While the exemplary embodiments are described in the context of a plasma etch system, the techniques and apparatus described herein is also adaptable to other processing systems used to perform other fabrication process (e.g., plasma deposition systems, three-dimensional printing systems, etc.)

The processing system 800 includes a grounded chamber 805. Process gases are supplied from gas source(s) 829 connected to the chamber through a mass flow controller 849 to the interior of the chamber 805. The gas source may be used as the primary source of dopants or etchants to the chamber. Any of a variety of suitable ionizable gases may be used in the process chamber. Examples of an ionizable gas include, but are not limited to, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $CHF_3$, $CF_4$, $C_2F_4$, $C_2F_6$, $C_2F_8$, $AsF_5$, $PF_3$, and $PF_5$, among others.

The chamber 805 is evacuated via an exhaust valve 851 connected to a high capacity vacuum pump stack 855. When plasma power is applied to the chamber 805, a plasma 818 is formed in a processing region over a workpiece 810. A plasma bias power 825 is coupled into the wafer support assembly 842 to draw the energized ions from the plasma to the workpiece. The plasma bias power 825 may be in a range of from 0.5 MHz to 60 MHz. The plasma bias power 825 is coupled to a lower electrode (not shown) via a power conduit 828. A second plasma source power 830 or branch of the same source is coupled to a plasma generating element 835 to provide high frequency source power to inductively or capacitively energize the plasma. The plasma source power 830 may have a higher frequency than the plasma bias power 825, such as between 1.8 and 880 MHz, and may, for example, be in the 13.56 MHz band. The pressure within the chamber may be controlled using the gas source valve 829 and the exhaust pump 855 under the control of a controller 870.

The workpiece 810 is loaded through an opening 815 and placed on the wafer support assembly 842 inside the chamber. The workpiece may be clamped, glued, or attached using an electrostatic force, vacuum or gravity. The workpiece 810, such as a semiconductor wafer bonded to a carrier, may be any type of wafer, substrate, or other material, including silicon, glass, or polymer for use in semiconductors, solar panel, optical waveguides, micromachines and other devices. The workpiece 810 is disposed on a top surface of a carrier that is disposed over a base assembly 844 of the chuck assembly. The base assembly provides temperature control, scanning, or other types of motion control. A scanning stage, which may be part of the base assembly may be used to scan the workpiece across the aperture or across multiple apertures to process one or more different locations or two-dimensional features on the workpiece.

A system controller 870 is coupled to a variety of different systems to control a fabrication process in the chamber. If the workpiece support is a thermally controlled chuck assembly, then the controller 870 may include a temperature controller 875 to execute temperature control algorithms (e.g., temperature feedback control) and may be either software or hardware or a combination of both software and hardware. The system controller 870 also includes a central processing unit 872, memory 873 and input/output interface 874.

The temperature controller receives a temperature reading from a sensor 843 on the chuck. The temperature sensor may be proximate a coolant channel, proximate the wafer, or placed in the dielectric material of the chuck. The temperature controller 875 uses the sensed temperature or temperatures to output control signals affecting the rate of heat transfer between the chuck assembly 842 and a heat source and/or heat sink external to the plasma chamber 805, such as a heater power supply 876 and a heat exchanger 877. The heater power supply provides current to drive one or more heaters (not shown) within the chuck assembly 842.

The system may also include a controlled heat transfer fluid loop 841 with flow controlled based on the temperature feedback loop. In the example embodiment, the temperature controller 875 is coupled to a heat exchanger (HTX)/chiller 877. Heat transfer fluid flows through a valve 881 at a rate controlled by the valve through the heat transfer fluid loop 841. The heat transfer fluid flows through conduits in the chuck assembly 842 and then returns to the HTX 877. The temperature of the heat transfer fluid is decreased by the HTX and then the fluid is returned through the loop back to the chuck assembly.

The valve 881 (or other flow control devices) between the HTX 877 and fluid conduits in the chuck assembly 842 may be controlled by the temperature controller 875 to control a rate of flow of the heat transfer fluid to the fluid loop. The electric heaters are used in the chuck assembly to apply heat to the chuck assembly.

A backside gas source 878 such as a pressurized gas supply or a pump and gas reservoir are coupled to the chuck assembly 842 through a mass flow meter 885 or other type of valve. The backside gas may be argon or any gas that provides heat conduction between the wafer and the chuck without affecting the processes of the chamber. The gas source pumps gas through a gas outlet of the chuck assembly to the back side of the wafer under the control of the system controller 870 to which the system is connected.

A conductive sheath modifier includes a pair of panels 812 and 814 defining a gap there between having a horizontal spacing. The sheath modifier may be formed of one piece, two pieces, or more pieces. The panels 812 and 814 may be a pair of sheets having a thin, flat shape, or any other desired shape including tube shaped, wedge shaped, or beveled. They may be formed of a conductor, semiconductor, or insulator material, depending on the particular implementation. The horizontal spacing of the gap defined by the pair of flat plate parts may be about 6.0 millimeters (mm). The pair of panels may also be positioned a vertical spacing (Z) above the plane of the top surface of the workpiece of about 3.0 mm. The sheath modifier has a second plate 816 directly below the gap to direct the ions angularly toward the workpiece.

The sheath modifier modifies the electric field within a plasma sheath 822 to control a shape of the boundary between the plasma 818 and the plasma sheath 822. In the illustrated example, the plasma angle modifier is a plate formed of a pair of conductors which may be fabricated of silicon carbide, doped silicon, doped anodized aluminum, molybdenum, etc. Alternatively, as shown in FIG. 6B, the sheath modifier may be formed of a single basis plate with a secondary plate all formed from the same or a similar material. When the bias source 825 biases the workpiece 810, ions are attracted across the plasma sheath through the gap, opening, or aperture in the plate at a selected range of incident angles. The angles depend on several different parameters including, but not limited to, the size of the gap, the vertical spacing (Z) of the base plate and the secondary plate above the workpiece, the dielectric constant and resistance of the plate, any bias applied to the plate, the bias applied to the workpiece, and other plasma process parameters.

A separate bias voltage may also be applied to the plate 812, 814, 816 using a separate plate bias voltage supply 824 under the control of the controller 870. The plate bias may be a constant DC voltage, a pulsed DC voltage, or an RF bias voltage. Alternatively, the plate may be grounded or allowed to float. The plate bias cooperates with the workpiece bias and the plate configuration to control the angular distribution of the plasma ions through the sheath. The plate may also be coupled to an actuator and in FIG. 5A to modify the parameters of the plate to suit a particular process. In some embodiments, no plate is used and the bias voltage on the workpiece is used to control the plasma ions.

The process chamber of FIG. 8, or another process chamber, may be used to create a variety of different ion energy distributions and angular ion distributions. In one example, the ion energy distribution is controlled in the chamber using a plasma that is generated with a Capacitively Coupled Plasma (CCP) source or an Inductively Coupled Plasma (ICP) source. Power within a range from about 400 W to 2000 W power is applied to the plasma source to ignite and maintain the plasma. An RF source is applied to an electrostatic wafer chuck to control ion energy. Compared to a DC biased workpiece, the RF biased workpiece significantly reduces the charge damage to the workpiece and allows precise control of AIDF.

The driven frequency of RF bias is in the range of 0.5 MHz to 60 MHz. The RF bias voltage is in the range of 100V p-p to 8000V p-p. Depending on the application, a different RF frequency power may be chosen to be applied to the pedestal. For example, in MRAM etch, two different angular ion fluxes are preferred. An undeflected or zero angle, high energy, ion flux is desired for vertical etch, but a high angle low energy ion flux is suitable for sidewall cleaning. Therefore compared to a high driven frequency, a low driven frequency works better in this case. As described above and shown in the context of FIGS. 1-4, the RF bias voltage frequency may be used to control the span of bimodal peaks of the IEDF. The RF bias voltage power may be used to control the magnitude of ion energy.

As described above, the geometry of the plate may be used to control the ion flux angle. A bimodal sheath modifier plate may be made, for example of SiC or a doped Si block. A 20-30 mm wide slit may be machined on the base plate. A 15 mm-20 mm wide second plate may be mounted 3-5 mm above or below the base plate. As shown in FIG. 7, there are two openings formed by combining the base plate and the second plate.

The sheath plate may be inserted into the plasma and placed 5 mm-10 mm above the workpiece, for example a wafer substrate. The plates may be grounded to zero potential so that the critical dimension of the sheath thickness is thinner than the plate opening. As a result, the ions are focused along the angle which is determined by the sheath shape around the plate surface. The two openings formed by the combined base plate and second plate create a bimodal angled ion flux that is collected on the wafer.

In such a plate, the ion energy along different angles is controllable. This allows for the process to be optimized for very small features. Compared to conventional dry plasma processes, the controlled angle allows for control over the quality of three dimensional processes. Different topographical features may be treated with different ion energy values.

As described herein, an RF biased plasma reduces charging damage to the workpiece. The ion energy angular distribution varies by changing the bias driven frequency and the geometry of the plate. Using a grounded extraction plate with a slit aperture in a plasma, different plasma beams, that is different ion flux values along different angles is achieved. Using a biased extraction plate additional control may be obtained over the angular distribution of the ions may be obtained. The plate may be biased with a constant DC, pulsed DC, or RF voltage supply. The control over angles is particularly helpful in plasma related process, such as 3-D selective etch, 3-D selective deposition, 3-D implantation etc.

Using the chamber of FIG. 8, a workpiece can be processed. As described above, a variety of different processes can be performed, from deposition, to etching, to amorphization, etc. A three dimensional feature, may be etched with a desired width, depth and taper by controlling the AIDF and IEDF. In one example, the plasma is generated at the plasma source with a particular RF plasma frequency and power. The plasma will have a plasma sheath adjacent to a front surface of the workpiece. When a plate is positioned between plasma sheath and the workpiece, then the sheath is formed near the plate.

FIG. 7 shows a plate that has two parallel parts at one level and a third part at a second level to define an aperture. A radio frequency bias voltage is applied to the workpiece, to control an angular bias of the ions from the sheath through the aperture in the excitation plate to the workpiece. The ions are accelerated between the plasma sheath and the workpiece by the bias voltage, e.g. to etch a three dimensional feature on the front surface of the workpiece.

In some processes chemical precursors are introduced into the plasma source before generating the plasma. The plasma contains reactive or inert gas ions. The reactive gas ions may be used to deposit a material such as an elemental semiconductor, a compound semiconductor, an oxide, a nitride, a carbide, a silicide, a ternary compound, an elemental metal, a metallic compound, a metallic alloy, a polymeric material, or a composite material. A variety of different ions may be used such as $P_xH_y$, $P_xC_y$, $B_xH_y$, $B_5C_y$, $C_xP_yH_z$, and $C_xB_yH_z$, $H_2$, or noble gases, where x, y, and z are integers greater than or equal to 1. In other processes the plasma contains only inert gas ions and the ions are used perform a mechanical process. Other types of plasmas and processes may be used as well.

One process is to generate the plasma in a plasma chamber that has a workpiece and a plate between the workpiece and the plasma. The plasma will form a sheath above the workpiece next to the plate. The plate has an aperture disposed between the plasma sheath and the workpiece to allow ions to pass through the plate to the workpiece. The plate is configured to modify the sheath to control the shape of the sheath.

An oscillating radio frequency bias voltage is generated and applied to a workpiece holder, which applies the bias voltage to the workpiece. This generates a workpiece bias voltage with respect to the plasma to attract ions across the plasma sheath toward the workpiece. The aperture and the frequency of the bias voltage controls the angle at which the ions are attracted toward the workpiece. If the workpiece has a top dielectric layer facing the plasma sheath then the top dielectric layer is alternately charged and discharged by the bias voltage.

A variety of different frequencies may be used for the bias voltage based on a desired angle at which the ions are attracted toward the workpiece. The frequency may be within a range of from 0.5 to 80 MHz in many cases. The bias voltage frequency may also be a combination to two or more oscillating radio frequency bias voltages. The second bias voltage may be at a second frequency or a second voltage or both. These are combined to control the angle at which the ions are attracted toward the workpiece. There may also be a delay between the RF signals to reduce or manage beat frequencies.

For some processes, in addition to controlling the plasma parameters and the bias voltages, the separation between the aperture and the plasma sheath may be adjusted to adjust the angle at which the ions are attracted toward the workpiece. This may be done by physically moving one or more parts of the plate or by adjusting the plasma parameters.

A bias voltage may also be applied to the plate at the aperture or across the whole plate. The plate bias voltage may be a DC voltage, a pulsed DC voltage, or a second oscillating radio frequency bias voltage. Alternatively, the plate may be grounded or allowed to float. Further control may be obtained by establishing a pressure differential between the plasma chamber and the workpiece while the ions are attracted toward the workpiece. The pressure differential has a first gas pressure in the plasma chamber that is higher than a second gas pressure proximate the workpiece.

Figure 9:
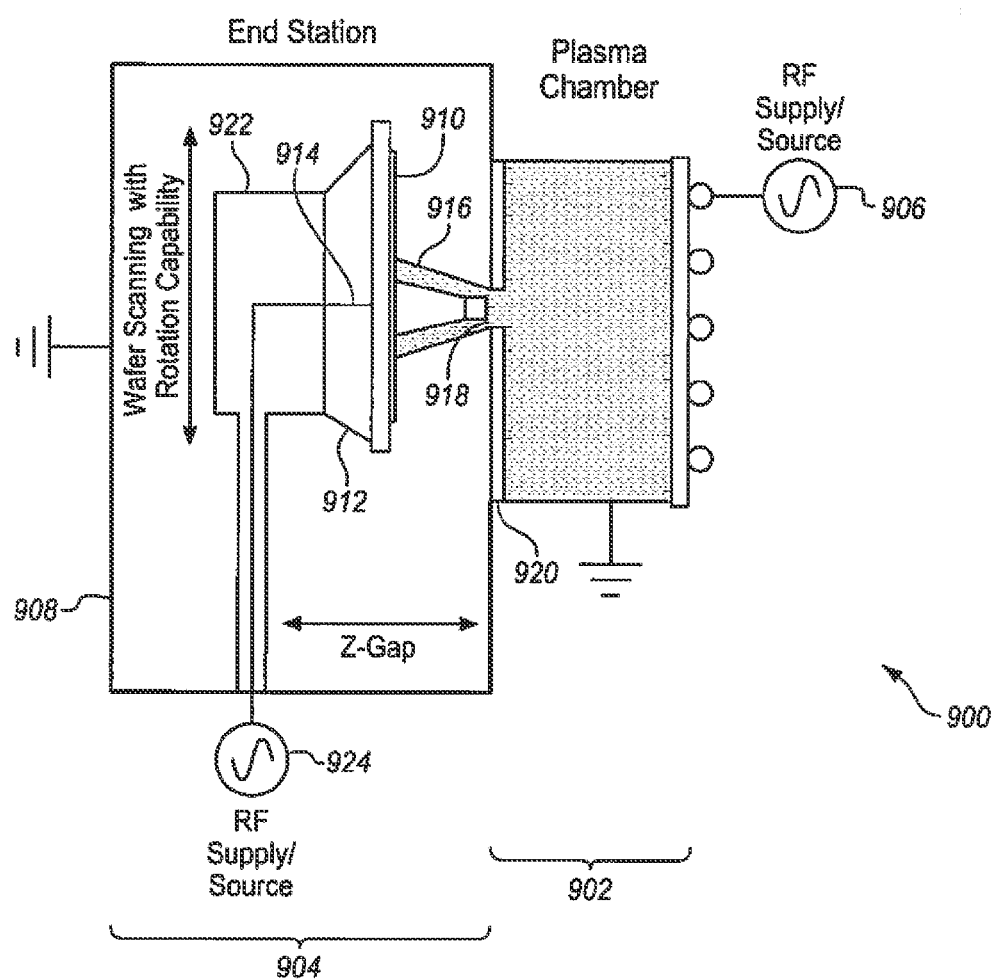
FIG. 9 is an alternative diagram of a plasma processing apparatus for a workpiece using a pedestal and a scanning stage according to an embodiment of the present invention.

FIG. 9 is an alternative diagram of a plasma processing system 900 according to an embodiment. The processing system has a plasma chamber portion 902 and an end station portion 904. The plasma chamber system may be similar to that of FIG. 8 and may include a source of gases, an RF source 906 to energize the plasma, a source for precursor chemicals to be introduced into the plasma and a variety of other components, depending on the particular process to be performed in the system and the particular implementation.

The end station portion includes a vacuum chamber 908 which contains a workpiece 910, such as a silicon wafer or any other desired type of material. The workpiece is carried by a pedestal 912 which may hold the wafer using electrostatic, vacuum, adhesive, or any other desired holding means. The pedestal holds the workpiece in place and may also provide thermal control, gas flow, and any other desired process elements. The pedestal receives a bias voltage 914 from a power source 924 as described above to draw ions 916 from the plasma to the workpiece. The ions are drawn through an aperture 918 in a plate 920. While only one aperture is shown, the plate may have one or more apertures depending on the particular process and how the process is to be performed.

The aperture 918 serves as an angle modifier to modify the angular bias of the plasma ions. In the illustrated example, the ions propagate at two complementary angles through the aperture to strike the workpiece 910 in two different locations. As described above, the particular position, angular bias, and number of ion beams may be modified by modifying the configuration of the plasma angle modifier 920 and by modifying the bias voltage, if any, applied to the angle modifier and the workpiece.

The pedestal is mounted to a scanning stage 922. The scanning stage has actuators (not shown), such as hydraulic pistons, solenoids, or stepping motors with appropriate gear train to provide two-dimensional (X-Y) lateral translation to move the workpiece across the aperture. By moving the workpiece in X and Y any desired position on the surface of the workpiece may be positioned under the aperture. Any feature on the workpiece may, accordingly, be treated with the plasma ion beam 916. By moving the workpiece across the aperture, the entire surface of the workpiece may be processed using only one apertures.

The scanning stage 922 may also offer rotation about an axis normal to the surface of the workpiece using a rotation electric motor and drive train (not shown) or any other desired drive system. Since the plasma beam ions 916 strike the workpiece at an angle, the effect of the ions differs depending on the rotational position of the workpiece. In the illustrated example, the workpiece pedestal may be rotated and translated simultaneously so that the angle and position of ion impact on the workpiece may be controlled. While the scanning stage is shown as moving the pedestal with respect to the aperture, the scanning state may be attached instead or in addition to the plate aperture. The aperture would then move laterally with respect to the top surface of the workpiece. Any relative motion between the workpiece and the aperture will allow the ions to be applied to different locations on the workpiece.

Figure 10:
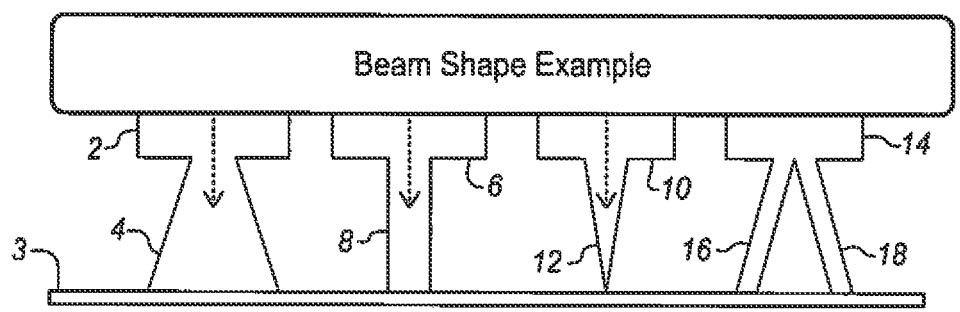
FIG. 10 is a diagram of different ion angular distributions using a plasma angle modifier according to an embodiment of the invention.

FIG. 10 is a diagram of a variety of different examples of plasma beam shapes that may be provided using the plasma angle modifiers and bias voltages described herein. In the first example, a plasma 2 is formed over a workpiece 3 and the angle modifier produces a cone shaped ion angle distribution 4. This is similar to that shown in FIG. 5B and may be obtained in the same or different way.

In the second example, the plasma 6 is formed over the workpiece and the angle modifier and bias voltages produce a straight column 8 of ion beam radiation. There is little or no angular modification. This may be done in the manner shown in FIG. 5B or in any other way.

In the third example, the plasma 10 is drawn through an angle modifier to form a pointed or focused ion beam 12. This may be done in the same way as shown in FIG. 5C or using a different type of angle modifier or plate.

In the fourth example, the plasma 14 is formed over the workpiece and two separate beams 16, 18 are formed at complementary angles. As in FIG. 7, the two beams both impact the workpiece and both may be used for processing the workpiece, depending on the particular processing to be performed.

It is to be understood that the above description is intended to be illustrative, and not restrictive. For example, while sequential diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of processing a workpiece comprising:
generating a plasma containing gas ions in a plasma chamber, the plasma forming a sheath above the workpiece, the sheath having an electric field;
modifying the plasma sheath using a plate having an aperture disposed between the plasma sheath and the workpiece;
generating an oscillating radio frequency bias voltage having a sequence of positive energy peaks and a sequence of negative energy peaks;
applying the bias voltage to a workpiece holder, the workpiece holder applying the bias voltage to the workpiece to generate a workpiece bias voltage with respect to the plasma to attract ions across the plasma sheath toward the workpiece, a time duration between the positive and negative peaks being determined by the radio frequency and being great enough to allow ions to respond separately to each peak, the time duration being selected to cause a selected annular distribution of the as ions impacting the workpiece from the sheath through the aperture with a bimodal distribution corresponding to the positive peaks for a first mode of the bimodal distribution and corresponding to the negative peaks for the second mode of the bimodal distribution, the selected bimodal annular distribution determining an angle at which the ions are attracted toward the workpiece.

2. The method of claim 1, wherein the workpiece has a top dielectric layer facing the plasma and wherein the top dielectric layer is alternately charged and discharged by the radio frequency bias voltage.

3. The method of claim 2, applying a radio frequency bias voltage comprises pulsing the radio frequency bias voltage at a rate slower than the radio frequency.

4. The method of claim 1, wherein the radio frequency for the bias voltage has a radio frequency within a range of from 0.5 to 80 MHz.

5. The method of claim 1, further comprising:
generating a second oscillating radio frequency bias voltage at a second frequency and a second voltage, having a second sequence of positive peak and a second sequence of negative peaks; and
combining the second bias voltage with the first bias voltage, and
wherein applying the bias voltage comprises applying the combined first and second bias voltage to the workpiece holder to control the angle at which the ions are attracted toward the workpiece.

6. The method of claim 1, further comprising adjusting a separation between the aperture and the plasma sheath to adjust the angle at which the ions are attracted toward the workpiece.

7. The method of claim 1, further comprising applying an aperture voltage to the plate.

8. The method of claim 7, wherein the aperture bias voltage is one of either a direct current voltage, a radio frequency voltage, or a ground potential.

9. The method of claim 7, wherein applying a bias voltage to the plate comprises either generating a pulsed voltage or generating a second oscillating radio frequency bias voltage and applying the generated bias voltage to the aperture.

10. The method of claim 1, further comprising establishing a pressure differential between the plasma chamber and the workpiece while the ions are attracted toward the workpiece, the pressure differential having a first gas pressure in the plasma chamber that is higher than a second gas pressure proximate the workpiece to reduce ion deflection on collision with the workpiece.

11. The method of claim 1, wherein the ions comprise reactive gas ions operable to deposit a material comprising one or more of: an elemental semiconductor, a compound semiconductor, an oxide, a nitride, a carbide, a silicide, a ternary compound, an elemental metal, a metallic compound, a metallic alloy, a polymeric material, or a composite material and wherein the ions are selected from the group consisting of PxHy, PxCy, CxHy, CxFy, CxHyFz, BxHy, BxCy, CxPyHz, CxByHz, $H_2$, and noble gases, wherein x, y, and z are integers greater than or equal to 1.

12. The method of claim 1, further comprising optimizing the angle at which the ions are attracted toward the workpiece by controlling at least one of plasma power, bias voltage, bias voltage frequency, pressure, and temperature.

13. The method of claim 1, wherein the aperture, is formed of a first sheet between the workpiece and the sheath having a gap and a second sheet between the first sheet and the workpiece extending across the gap, the second sheet being displaced from the first sheet so that there is an opening on either side of the second sheet above the second sheet, the method comprising adjusting the displacement between the first and the second sheet using an actuator mechanically coupled to at least one of the first and the second sheet.

14. The method of claim 1, wherein a range of incident angles of the ions relative to the workpiece is dependent, in part, on the shape of the boundary between the aperture and the plasma sheath, the method comprising adjusting the range of incident angles by modifying a distance between the aperture and the sheath.

15. The method of claim 14, wherein the bimodal distribution of incident angles has two center angles with distributions about each center angle.

16. The method of claim 1, wherein the attracted ions are accelerated between the plasma sheath shaped by the plate and the workpiece by the bias voltage to etch a three dimensional feature on a front surface of the workpiece.

17. The method of claim 1, further comprising introducing chemical precursors into a plasma source before generating the plasma.

* * * * *